(12) United States Patent
Sakano

(10) Patent No.: US 8,785,834 B2
(45) Date of Patent: Jul. 22, 2014

(54) SOLID-STATE IMAGE SENSOR, CONTROL METHOD FOR THE SAME, AND ELECTRONIC DEVICE

(71) Applicant: Sony Corporation, Tokyo (JP)

(72) Inventor: Yorito Sakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/961,616

(22) Filed: Aug. 7, 2013

(65) Prior Publication Data

US 2014/0077058 A1    Mar. 20, 2014

(30) Foreign Application Priority Data

Sep. 14, 2012    (JP) .................................. 2012-203207

(51) Int. Cl.
*H04N 5/335*    (2011.01)
*H01L 27/148*   (2006.01)

(52) U.S. Cl.
USPC ............... 250/208.1; 250/214.1; 257/230; 257/292; 348/299; 348/308

(58) Field of Classification Search
USPC ........ 250/208.1, 214.1, 214 R; 257/225, 229, 257/230, 291, 292; 348/294, 296, 299, 308
See application file for complete search history.

(56) References Cited

U.S. PATENT DOCUMENTS

| 8,284,282 | B2* | 10/2012 | Oike ............................. 348/294 |
| 8,605,181 | B2* | 12/2013 | Maes et al. .................... 348/302 |
| 2009/0251582 | A1 | 10/2009 | Oike | |
| 2013/0341684 | A1* | 12/2013 | Fukuro et al. ................. 257/230 |

FOREIGN PATENT DOCUMENTS

| JP | 2004-111590 | 4/2004 |
| JP | 2008-177593 | 7/2008 |
| JP | 2011-199816 | 10/2011 |

* cited by examiner

*Primary Examiner* — Kevin Pyo
(74) *Attorney, Agent, or Firm* — Rader, Fishman & Grauer PLLC

(57) ABSTRACT

There is provided a solid-state image sensor including a plurality of unit pixels each including a photoelectric transducer generating a charge corresponding to an amount of incident light and accumulating the charge therein, a first transfer gate transferring the charge accumulated in the photoelectric transducer, a charge holding region where the charge is held, a second transfer gate transferring the charge, a floating diffusion region where the charge is held to be read out as a signal, a charge discharging gate transferring the charge to a charge discharging part, and a structure including an overflow path formed in a boundary portion between the photoelectric transducer and the charge holding region.

7 Claims, 15 Drawing Sheets

PRIOR ART

PRIOR ART

PRIOR ART

FIG. 6
A  t41
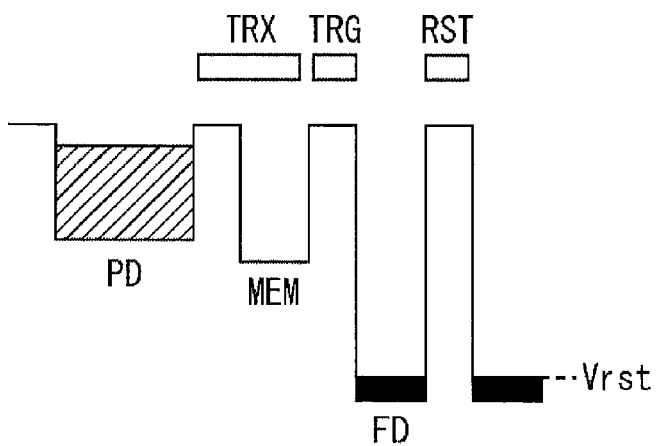
B  t42
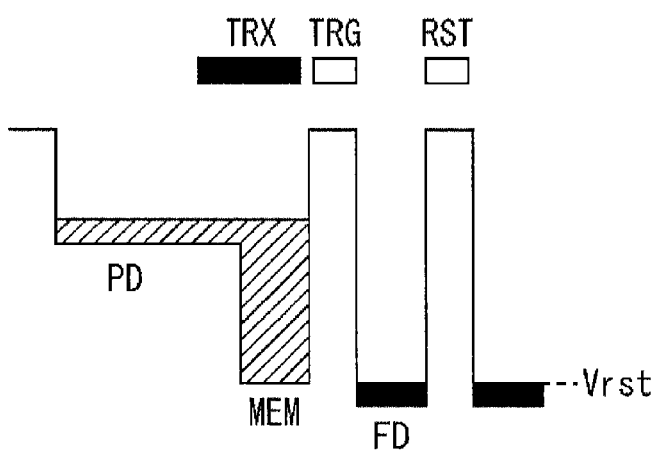
C  t43
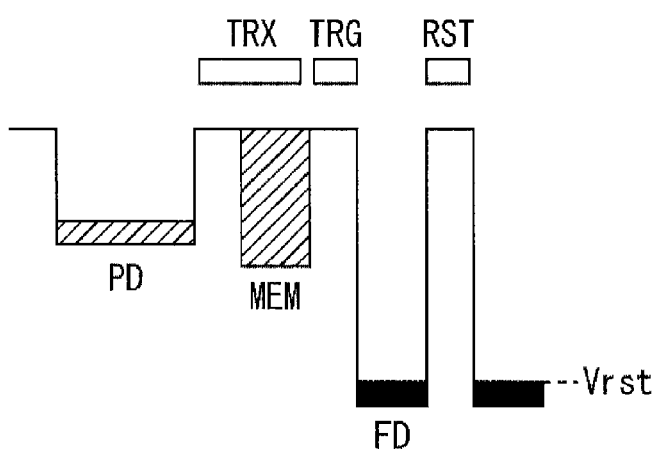
PRIOR ART

PRIOR ART

PRIOR ART

SOLID-STATE IMAGE SENSOR, CONTROL METHOD FOR THE SAME, AND ELECTRONIC DEVICE

BACKGROUND

The present technology relates to a solid-state image sensor, a control method therefor, and an electronic device, and particularly relates to a solid-state image sensor, a control method therefor, and an electronic device which make it possible to generate an image suitable for use.

In a general image sensor which reads charges accumulated in a light receiving part such as a photo diode through a MOS transistor, a readout operation is executed in units of a pixel, a row, or the like, and thus it is not possible to synchronize, in all of pixels, an exposure time period during which photocharges are accumulated. Accordingly, in such a case that a subject is moving, a captured image has distortion.

Hence, a pixel structure as illustrated in FIG. 1 is known. In the structure, unit pixels 20A each has a memory part (MEM) 23 therein, a charge accumulated in a photo diode (PD) 21 is transferred to the memory part 23 in each pixel simultaneously, and the charge is held until a readout operation to be performed in row unit. This configuration enables an image capturing operation using global exposure employing the same exposure time period for all the pixels for image capturing.

FIG. 2 is a timing chart illustrating an example of driving the unit pixels 20A in an exposure and charge accumulation time period. Firstly, in a time period between time t1 and time t2, a first transfer gate (TRX) 22, a second transfer gate (TRG) 24, and a reset transistor (RST) 26 are turned on to discharge charges in the photo diode 21 and the memory part 23.

Next, in a time period between time t2 and time t3, a charge newly obtained from light from the subject after the charge discharging is accumulated in the photo diode 21 in each pixel simultaneously. Then, in a time period between time t3 and time t4, the second transfer gate 24 and the reset transistor 26, and then the first transfer gate 22 are turned on, so that the charge accumulated in the photo diode 21 is transferred to the memory part 23 in each pixel simultaneously.

FIG. 3 is a timing chart illustrating an example of driving the unit pixels 20A in readout scanning (reading out a signal charge in row units). Firstly, a control pulse SEL and thereafter a control pulse RST are turned on. Then, in a time period between time t11 and time t12, a noise level of a floating diffusion (FD) 25 is read out. Then, a transfer pulse TRG in a time period between time t12 and time t13 is turned on, the second transfer gate 24 transfers a charge held in the memory part 23 to the floating diffusion 25. Then, in a time period between time t13 and time t14, a voltage corresponding to the charge held in the floating diffusion 25 is read out as a signal level. A difference between the signal level read out in this way and the noise level previously read out is obtained, so that a signal level with noise removed is thereby obtained.

Meanwhile, as illustrated in a timing chart in FIG. 4, the exposure and charge accumulation and the readout scanning of two-dimensionally arranged pixels can be performed in the same time period. In other words, as illustrated in FIG. 4, when a control pulse RST is turned on while a control pulse SEL is turned on, the noise level of the floating diffusion 25 is read out in a time period between time t22 and time t23. Moreover, when a transfer pulse TRG is turned on, a voltage corresponding to the charge held in the floating diffusion 25 after being transferred from the memory part 23 is read out as a signal level in a time period between time t24 and time t25. Note that the signal charge is read out in row units in a time period from time t22 to time t25.

Thereafter, the control pulse SEL is turned off, then the control pulse RST, a transfer pulse TRX, and the transfer pulse TRG are turned on, and further the transfer pulse TRX, the transfer pulse TRG, and the control pulse RST are turned off in this order. Thereby, charges in the photo diode 21 and the memory part 23 are discharged in a time period between time t25 and time t26. Note that charges in a plurality of rows are simultaneously discharged in the time period between time t25 and time t26. In the exposure and accumulation after time t26, a charge newly obtained from light from the subject is accumulated in each photo diode 21.

As described above, charge signals are serially read out in row units in the unit pixels 20A. While the readout is performed on a certain row, the charge discharging operation is executed for a plurality of rows or for all the pixels simultaneously. While a pixel signal is readout in the continued row scanning, the exposure and accumulation operation is continued and a charge transfer operation is executed for a plurality of rows or for all the pixels simultaneously.

Meanwhile, in the structure of the pixel illustrated in FIG. 1, the pixel is provided with the memory part 23, and thus has a lower maximum charge amount (saturation charge amount) allowed to be accumulated in the photo diode 21 than a pixel without the memory part 23 has. Since a substantial saturation charge amount is a smaller one of the maximum charge amount allowed to be accumulated in the photo diode 21 and the maximum charge amount allowed to be accumulated in the memory part 23, it is necessary to maximize both the photo diode 21 and the memory part 23. In other words, the saturation charge amount of the pixel including the memory part 23 is approximately half of the saturation charge amount of the pixel without the memory part 23.

FIG. 5 is a cross-sectional diagram illustrating a structure of a unit pixel corresponding to the circuit diagram in FIG. 1. In the structure illustrated in FIG. 5, the area (volume) of the photo diode 21 is smaller than that of the photo diode 21 of the unit pixel without the memory part 23. Further, an increased area of the photo diode 21 leads to a decreased area of the memory part 23, and thus it is not possible to maintain the maximum charge amount of the photo diode 21. Consequently, it is not possible to increase a charge amount allowed to be handled. Specifically, FIG. 6 illustrates how a charge is transferred from the photo diode 21 to the memory part 23 in a time period between time t41 and time t43. It is obvious that an increased area of the photo diode 21 leads to a decreased area of the memory part 23.

Hence, the applicant proposes a structure of a pixel as illustrated in FIG. 7. In the structure, an overflow path 37 is formed between a photo diode 21 and a memory part 23 which are provided in the pixel (see JP 2009-268083A, for example). Employing the structure makes it possible to accumulate charges in both the photo diode 21 and the memory part 23 in the exposure time period and thus to increase the saturation charge amount. In another configuration, a barrier between a photo diode 21 and a memory part 23 is intermittently modulated during the exposure time period, and thereby it is also possible to accumulate charges in both the photo diode 21 and the memory part 23, like the case of forming the overflow path 37.

Note that the applicant proposes a structure of a pixel, as illustrated in FIG. 8, including a charge discharging gate 29 for directly discharging a signal charge in a photo diode 21 without passing through a floating diffusion 25 (see JP 2004-111590A, for example). Employing the structure makes it possible to prevent an unrequired charge from leaking from the photo diode 21 into the floating diffusion 25 while a charge is accumulated in a memory part 23, that is, while a charge signal is serially read out in each row. The applicant also proposes feasibility of an exposure operation in a shorter time than a one-frame readout time period, the operation being achieved in such a manner that a channel electric-potential at the time of turning on a charge discharging gate 29 is set higher than an electric-potential causing the photo diode 21 to be completely depleted (see JP 2008-177593A, for example).

Further, the applicant proposes a structure in which: pixels each include two memory parts having different capacitances per unit area and properties at dark; and overflow paths are formed between a photo diode and one of the memory parts and between the photo diode and the other (see JP 2011-199816A, for example). When the structure is employed, it is possible to efficiently increase a saturation charge amount by selectively using one of the two memory parts according to a signal charge amount.

SUMMARY

Meanwhile, in the pixel structure disclosed in JP 2009-268083A, it is possible to accumulate charges whose amount is equivalent to a sum of those of the photo diode 21 and the memory part 23, and the charges are held in the memory part 23 and the floating diffusion 25. Thus, it is possible to achieve a saturation charge amount equivalent to that of the pixel without the memory part 23, but is not possible to synchronize an exposure time period with a readout time period (charge holding time period).

This is because the photo diode 21 and the memory part 23 are used in accumulating charges during the exposure time period. Further, since the charges are held in the memory part 23 and the floating diffusion 25 in the readout time period (charge holding time period), the memory part 23 is given functions of both accumulating and holding the charges.

Here, particularly when a pixel signal is used for a moving image, it is effective to set the exposure time period and the readout time period (charge holding time period) to synchronize with each other, for increasing the frame rate. If the exposure time period and the readout time period are separated, the frame rate is reduced by an amount corresponding to the exposure time period.

On the other hand, when a pixel signal is used for a still image, it is desired to set the exposure time period and the readout time period (charge holding time period) separately to increase the saturation charge amount. In other words, it is important that the exposure time period and the readout time period are separated for still image use and that the exposure time period is synchronized with the readout time period for moving image use.

However, in the aforementioned technologies in the related art, it is necessary to prepare separate image sensors to achieve both the case of setting the exposure time period and the readout time period separately and the case of setting the exposure time period and the readout time period to synchronize with each other. It is not possible to generate images for the respective still image use and moving image use by using one image sensor.

For this reason, it is desired that an image suitable for use is generated by using one image sensor.

The present technology has been provided under such circumstances and makes it possible to generate an image suitable for use by using one image sensor.

According to a first embodiment of the present technology, there is provided a solid-state image sensor including a plurality of unit pixels each including a photoelectric transducer which generates a charge corresponding to an amount of incident light and accumulates the charge therein, a first transfer gate which transfers the charge accumulated in the photoelectric transducer, a charge holding region in which the charge transferred from the photoelectric transducer by the first transfer gate is held, a second transfer gate which transfers the charge held in the charge holding region, a floating diffusion region in which the charge transferred from the charge holding region by the second transfer gate is held to be read out as a signal, a charge discharging gate which transfers the charge received from the photoelectric transducer, to a charge discharging part, and a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region. As a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

When an intermediate electric-potential is applied to the charge discharging gate as a gate electric-potential, the channel electric-potential may be set at a predetermined electric-potential.

When an electric-potential of a drain of the charge discharging part is driven, the channel electric-potential may be set at a predetermined electric-potential.

A channel of the charge discharging gate may be formed in a region deeper in a direction to a substrate than a silicon surface.

An off-state voltage of each of the charge discharging gate, the first transfer gate, and the second transfer gate may be a negative voltage.

According to the first aspect of the present technology, there is provided a control method for the aforementioned solid-state image sensor according to the first aspect of the present technology.

In the solid-state image sensor and the control method in the first embodiment of the present technology, as the channel electric-potential of the charge discharging gate, the electric-potential lower than the electric-potential of the overflow path is set, or the electric-potential higher than the electric-potential of the overflow path and lower than the electric-potential causing the photoelectric transducer to be completely depleted is set.

According to a second embodiment of the present technology, there is provided an electronic device having a solid-state image sensor mounted thereon, the solid-state image sensor including a plurality of unit pixels each including a photoelectric transducer which generates a charge corresponding to an amount of incident light and accumulates the charge therein, a first transfer gate which transfers the charge accumulated in the photoelectric transducer, a charge holding region in which the charge transferred from the photoelectric transducer by the first transfer gate is held, a second transfer gate which transfers the charge held in the charge holding region, a floating diffusion region in which the charge transferred from the charge holding region by the second transfer gate is held to be read out as a signal, a charge discharging gate which transfers the charge received from the photoelectric transducer, to a charge discharging part, and a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region. As a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

The electronic device may be an independence device or may be an internal block as a component of one device.

In the electronic device in the second embodiment of the present technology, as the channel electric-potential of the charge discharging gate, the electric-potential lower than the electric-potential of the overflow path is set, or the electric-potential higher than the electric-potential of the overflow path and lower than the electric-potential causing the photoelectric transducer to be completely depleted is set.

According to the first and second embodiments of the present technology, it is possible to generate an image suitable for use.

BRIEF DESCRIPTION OF THE DRAWINGS

FIG. 6 is a potential diagram illustrating a method for driving the unit pixels in the related art;

DETAILED DESCRIPTION OF THE EMBODIMENTS

Figure 1:
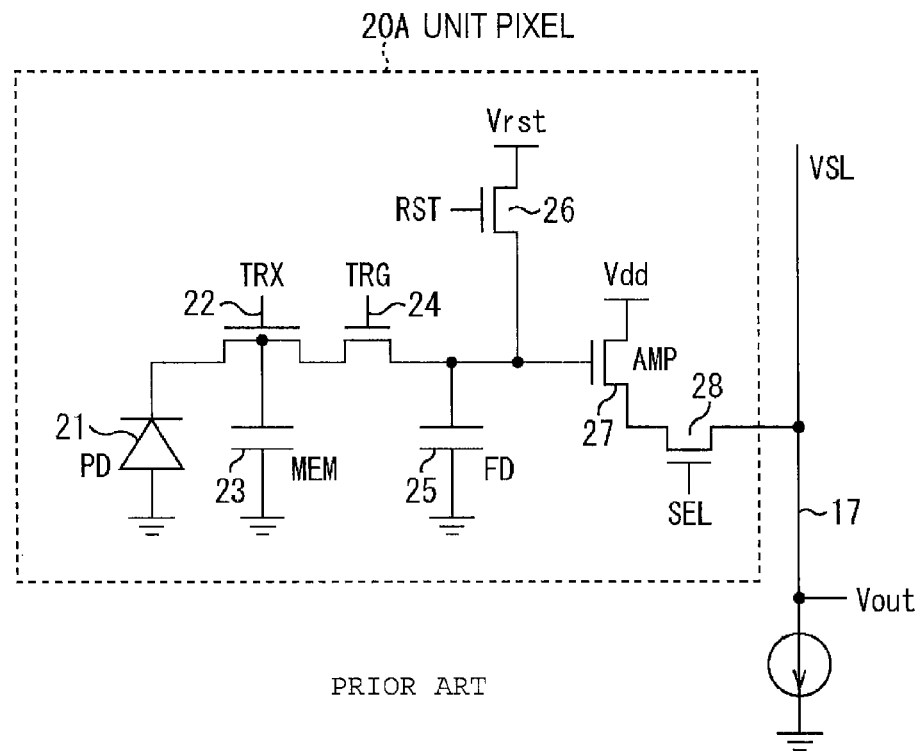
FIG. 1 is a circuit diagram illustrating a configuration of each of unit pixels in related art.
Figure 2:
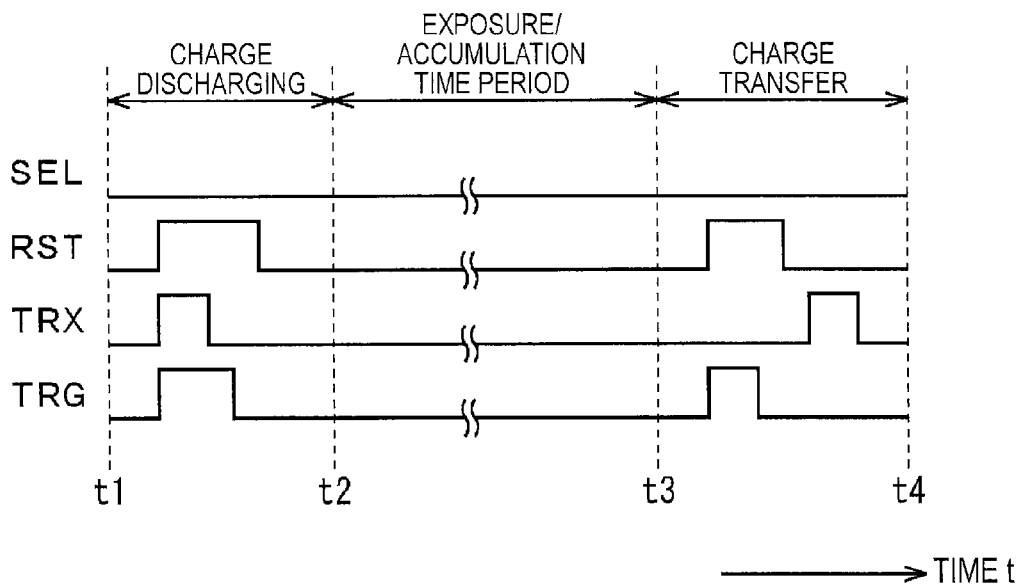
FIG. 2 is a timing chart illustrating a method for driving the unit pixels in the related art.
Figure 3:
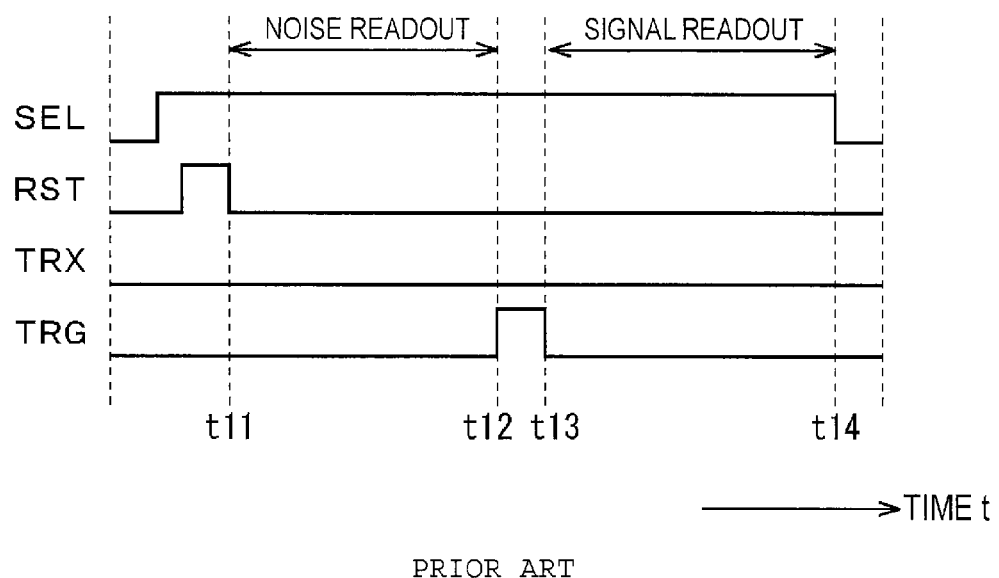
FIG. 3 is a timing chart illustrating a method for driving the unit pixels in the related art.
Figure 4:
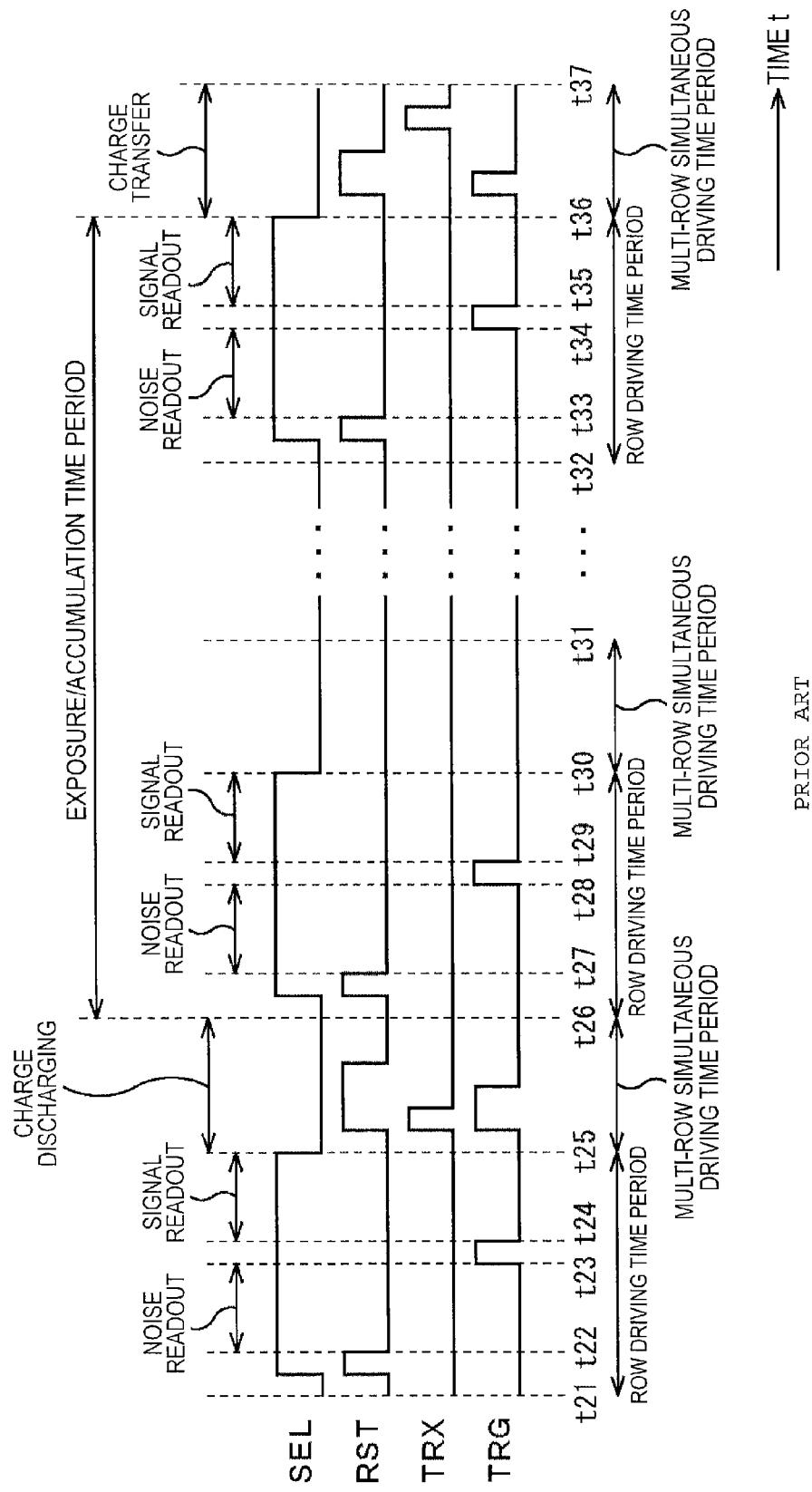
FIG. 4 is a timing chart illustrating a method for driving the unit pixels in the related art.
Figure 5:
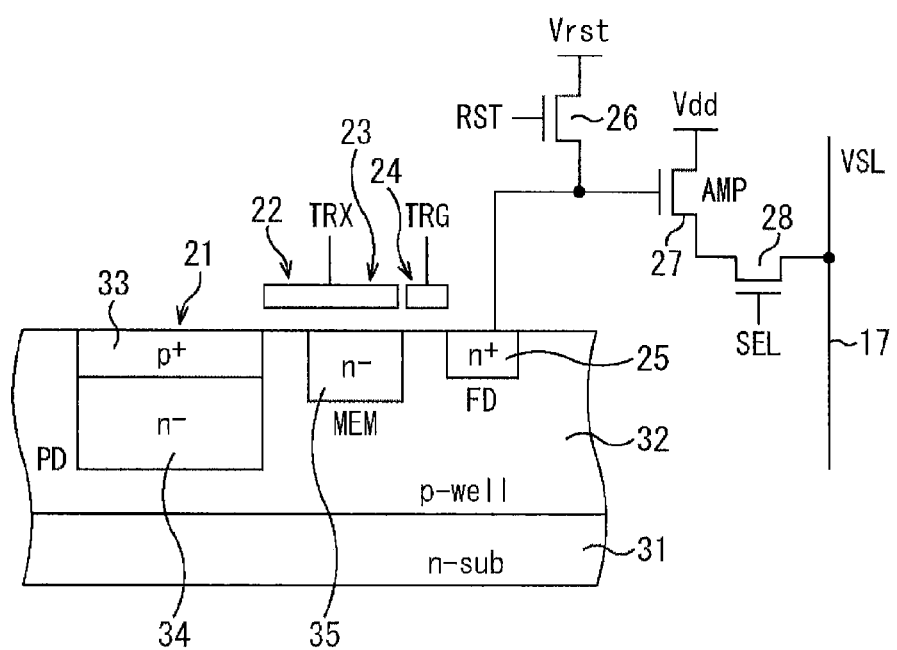
FIG. 5 is a cross-sectional diagram of the one unit pixel in the related art.
Figure 7:
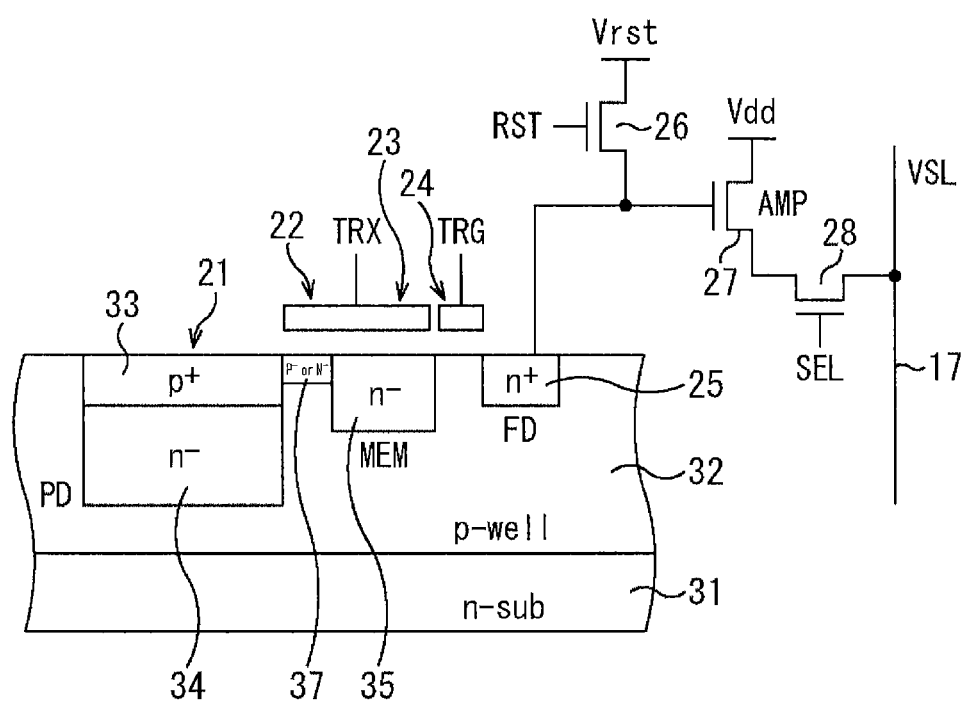
FIG. 7 is a cross-sectional diagram illustrating a configuration of each of unit pixels in related art.
Figure 8:
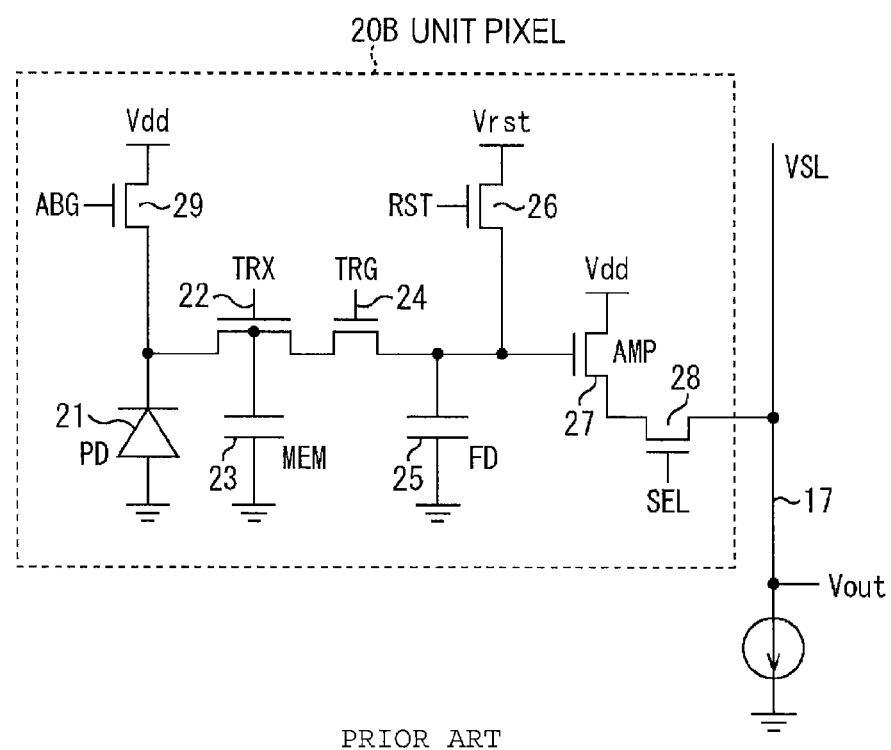
FIG. 8 is circuit diagram illustrating a configuration of each of unit pixels in related art.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

[Configuration Example of Solid-State Imaging Apparatus]

Figure 9:
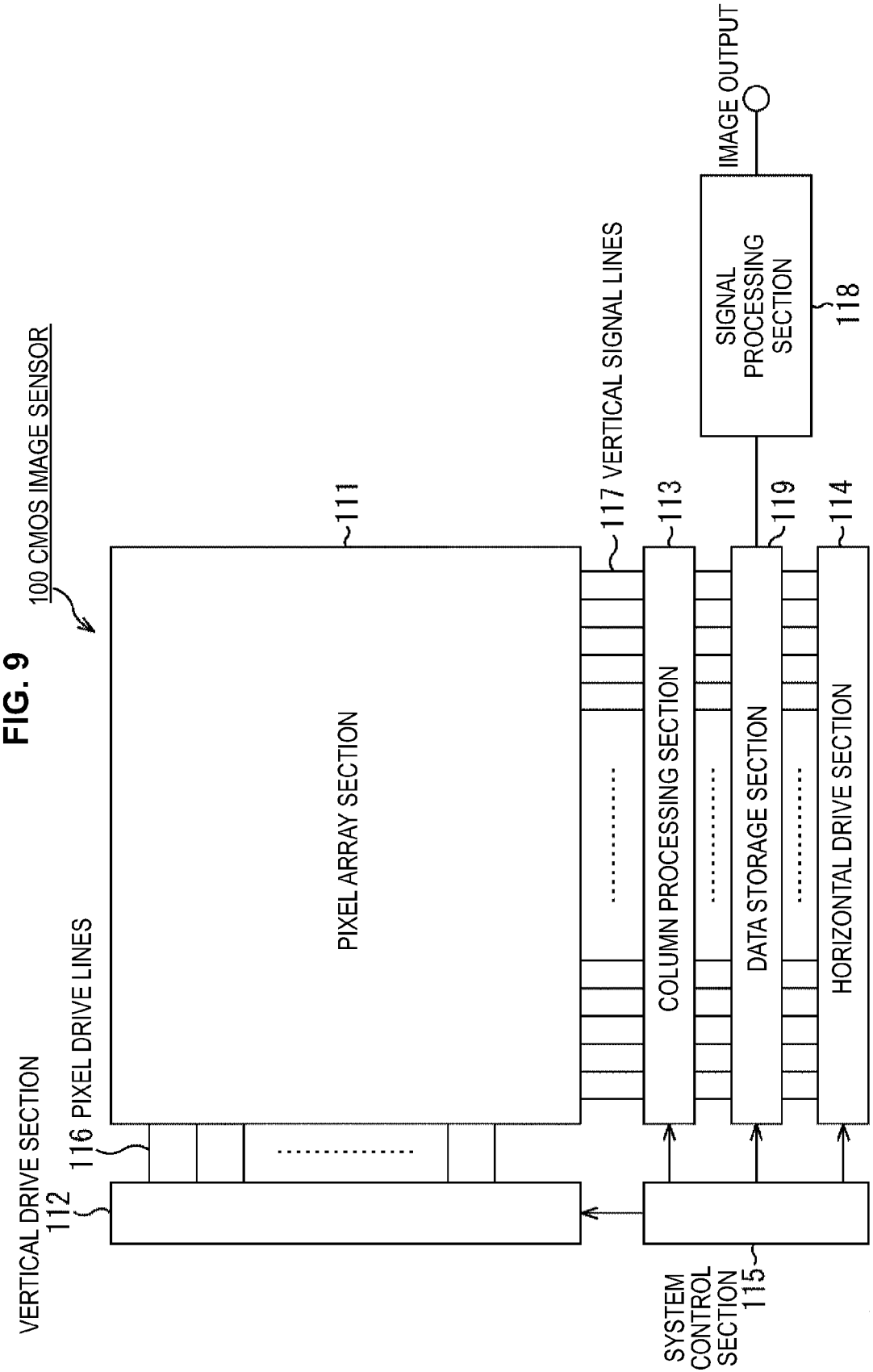
FIG. 9 is a diagram illustrating a configuration example of a CMOS image sensor.

FIG. 9 is a block diagram illustrating a configuration example of a CMOS image sensor which is a solid-state imaging apparatus to which an embodiment of the present technology is applied.

As illustrated in FIG. 9, a CMOS image sensor 100 according to the present embodiment has a configuration including a pixel array section 111 which is formed on a not-shown semiconductor substrate (chip), and peripheral circuits which are integrated on the same semiconductor substrate on which the relevant pixel array section 111 is formed. The peripheral circuits include a vertical drive section 112, a column processing section 113, a horizontal drive section 114 and a system control section 115, for example.

The CMOS image sensor 100 further includes a signal processing section 118 and a data storage section 119. The signal processing section 118 and the data storage section 119 may be configured of external signal processing sections such, for example, as DSPs (Digital Signal Processors), or the like, or may be mounted on the same substrate on which the CMOS image sensor 100 is formed.

In the pixel array section 111, unit pixels (hereinafter, sometimes referred to simply as "pixels") each having a photoelectric transducer generating charge in a charge amount corresponding to an amount of incident light to accumulate it therein are two-dimensionally arranged in a matrix form. The configuration of the unit pixel will be described later.

In the pixel array section 111, pixel drive lines 116 are formed in the horizontal direction in the figure (arrangement direction of pixels in pixel row) for each row with respect to the pixel arrays arranged in a matrix form, and vertical signal lines 117 are formed in the vertical direction (arrangement direction of pixels in pixel column) in the figure for each column. In FIG. 6, each pixel drive line 116 is indicated as one line, whereas it is not limited to one in reality. One end of the pixel drive line 116 is connected to an output terminal corresponding to each row of the vertical drive section 112.

The vertical drive section 112 is configured of a shift register, an address decoder and the like, and is a pixel drive section driving the individual pixels of the pixel array section 111 simultaneously for all pixels, or in row unit, or the like. This vertical drive section 112, the specific configuration of which is omitted in the figure, typically includes two scanning systems of a readout scanning system and a sweep scanning system.

To read signals from the unit pixels of the pixel array section 111, the readout scanning system performs selective scanning on the unit pixels serially in row unit. The sweep scanning system performs sweep scanning on a read-out row to be subjected to readout scanning by the readout scanning system. The sweep scanning precedes the readout scanning by a time equivalent to a shutter speed.

By sweep scanning due to the sweep scanning system, unrequired charges are swept out of the photoelectric transducers of the unit pixels in the read-out row (are reset). By this sweeping-out (resetting) of the unrequired charges due to the sweep scanning system, so-called electronic shutter operation is performed. Herein, the electronic shutter operation is an operation of discarding the charges of the photoelectric transducers and newly starting exposure (starting accumulation charges).

A signal read out by readout operation due to the readout scanning system corresponds to the amount of light having been incident after the immediately preceding readout operation or electronic shutter operation. Then, a time period from readout timing or sweep timing due to the immediately preceding readout operation or electronic shutter operation to readout timing due to the current readout operation is an accumulation time (exposure time) of the charge in the unit pixel.

Signals outputted from individual unit pixels in pixel row having undergone selective scanning due to the vertical drive section 112 are supplied to the column processing section 113 through the respective vertical signal lines 117. The column processing section 113 performs predetermined signal processing on the signals outputted from the individual unit pixels in selected row through the vertical signal line 117 for the respective pixel columns of the pixel array section 111, and in addition, temporarily holds the pixel signals after the signal processing.

Specifically, the column processing section 113 performs at least noise removing processing, for example, CDS (Correlated Double Sampling) processing as the signal processing. By this CDS processing due to the column processing section 113, fixed pattern noises intrinsic to pixels such as reset noise and scattering of thresholds of amplification transistors is removed. The column processing section 113 can be provided not only with the function of the noise removing processing but, for example, with an AD (Analog Digital) conversion function, so as to output signal levels in digital signals.

The horizontal drive section 114 is configured of a shift register, an address decoder and the like, and sequentially selects unit circuits corresponding to individual pixel columns in the column processing section 113. By selective scanning due to this horizontal drive section 114, the pixel signals having undergone the signal processing in the column processing section 113 are sequentially outputted.

The system control section 115 is configured of a timing generator generating various timing signals, and the like, and performs drive controls on the vertical drive section 112, the column processing section 113, the horizontal drive section 114 and the like based on the various timing signals generated by the relevant timing generator.

The signal processing section 118 has at least an addition processing function, and performs various kinds of signal processing such as the addition processing on the pixel signals outputted from the column processing section 113. The data storage section 119 temporarily stores data used for such processing as the signal processing in the signal processing section 118.

[Unit Pixel Configuration]

Figure 10:
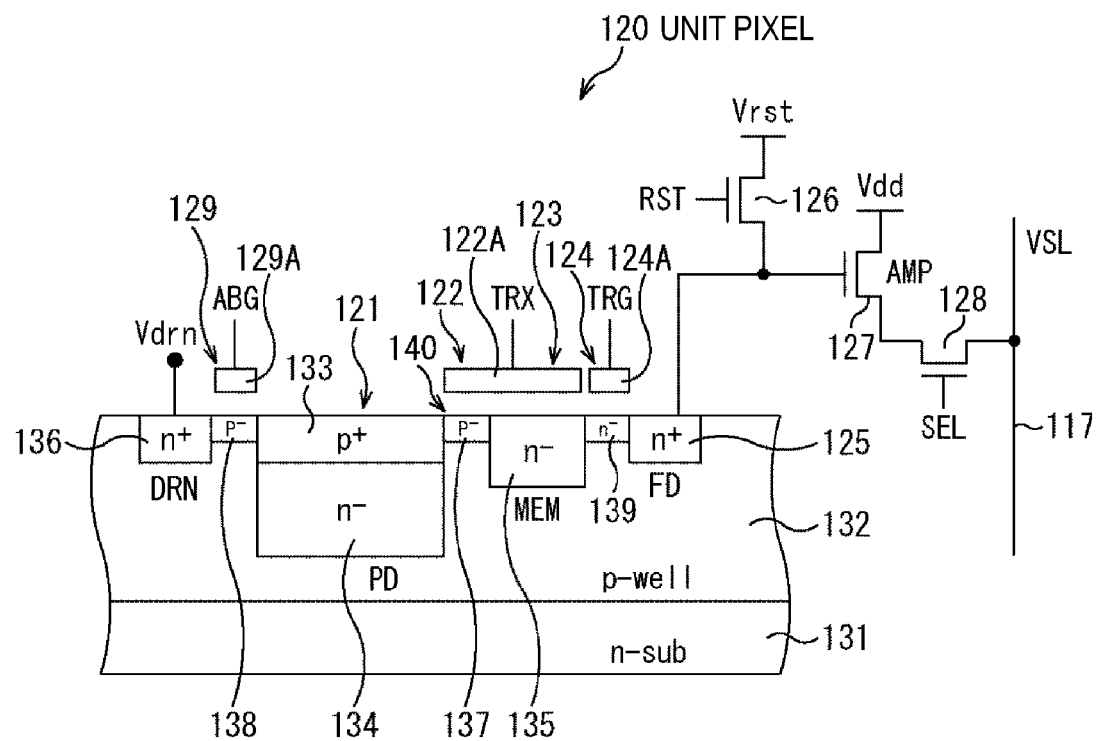
FIG. 10 is a cross-sectional diagram illustrating a configuration example of each of unit pixels.

Next, a specific configuration of each of unit pixels 120 arranged in the matrix form in the pixel array section 111 in FIG. 9 will be described with reference to FIG. 10. FIG. 10 illustrates a plan diagram of the configuration of the unit pixel 120.

The unit pixel 120 includes, as the photoelectric transducer, a photodiode (PD) 121, for example. The photo diode 121 is a buried photodiode formed, for example, by forming a p-type layer 133, on the substrate-front-surface side, in a p-type well layer 132 formed on an n-type substrate 131 and by burying an n-type buried layer 134 in the p-type well layer 132. Note that the p-type layer 133 and the n-type buried layer 134 each have an impurity density causing a depletion state at the time of discharging a charge therefrom.

The unit pixel 120 includes a first transfer gate (TRX) 122, a memory part (MEM) 123, a second transfer gate (TRG) 124, and a floating diffusion (FD) 125, in addition to the photo diode 121. Although not being shown, a light shielding film shields the unit pixel 120 from light. The light shielding film shields, from light, portions other than opening portions through which light is introduced into the photo diode 121 and contact portions of transistors.

The first transfer gate 122 includes: a gate electrode 122A formed by a polycrystalline semiconductor. The gate electrode 122A is formed in such a manner as to cover a portion between the photo diode 121 and the memory part 123 and part or all of an upper portion of the memory part 123. A contact for wiring is connected to an upper portion of the gate electrode 122A on the memory part 123 side. When a transfer pulse TRX is applied to the gate electrode 122A through the contact, the first transfer gate 122 transfers a charge accumulated in the photo diode 121.

The memory part 123 is formed by an n-type buried channel 135 formed below the gate electrode 122A and having an impurity density causing a depletion state at the time of discharging the charge therefrom, and accumulates therein the charge transferred by the first transfer gate 122 from the photo diode 121.

In addition, it is possible to perform modulation on the memory part 123 by arranging the gate electrode 122A in the upper portion of the memory part 123 and by applying the transfer pulse TRX to the gate electrode 122A. In other words, applying the transfer pulse TRX to the gate electrode 122A leads to a deep potential of the memory part 123. This leads to a larger saturation amount of the charge in the memory part 123 than that in the case without modulation.

The second transfer gate 124 includes a gate electrode 124A formed by a polycrystalline semiconductor. The gate electrode 124A is formed in an n-impurity diffusion region 139 provided above a boundary portion between the memory part 123 and the floating diffusion 125. In addition, a contact for wiring is connected to an upper portion of the gate electrode 124A. Then, when a transfer pulse TRG is applied to the gate electrode 124A through the contact, the second transfer gate 124 transfers a charge accumulated in the memory part 123.

The floating diffusion 125 is a charge voltage transducer formed by an n-type layer having an impurity density enabling electrical connection of a contact for wiring and converts, into a voltage, the charge transferred by the second transfer gate 124 from the memory part 123. The contact for wiring is connected to an upper portion of the floating diffusion 125.

A reset transistor 126 is connected between a power supply Vrst and the floating diffusion 125, and resets the floating diffusion 125 when a control pulse RST is applied to a gate electrode of the reset transistor 126.

A drain electrode and a gate electrode of an amplification transistor 127 are connected to a power supply Vdd and the floating diffusion 125, respectively. A drain electrode and a source electrode of a select transistor 128 are connected to a source electrode of the amplification transistor 127 and the corresponding vertical signal line 117, respectively.

When a control pulse SEL is applied to a gate electrode of the select transistor 128, the select transistor 128 selects one of the unit pixels 120 from which a signal should be read out. When the select transistor 128 selects the unit pixel 120 from which the pixel signal should be read out, the amplification transistor 127 reads out, amplifies, and outputs the pixel signal indicating a voltage of the floating diffusion 125, from the source electrode of the amplification transistor 127. The select transistor 128 supplies the column processing section 113 through the vertical signal line 117 with the pixel signal from the amplification transistor 127.

The unit pixel 120 further includes a charge discharging gate (ABG) 129 and a drain part 136. The charge discharging gate 129 includes a gate electrode 129A. The gate electrode 129A is formed above a p-impurity diffusion region 138 provided between the photo diode 121 and the drain part 136. A contact for wiring is connected to an upper portion of the gate electrode 129A. When a control pulse ABG is applied to the gate electrode 129A through the contact, the charge discharging gate 129 transfers the charge accumulated in the photo diode 121.

The drain part 136 is a charge discharging part formed by an n-type layer, and discharges the charge transferred by the charge discharging gate 129 from the photo diode 121. A contact for wiring is connected to an upper portion of the drain part 136, and a predetermined voltage Vdrn is applied to the drain part 136 as appropriate.

In addition, the unit pixel 120 is provided with a p-impurity diffusion region 137 below the gate electrode 122A and in a boundary portion between the photo diode 121 and the memory part 123. Providing the impurity diffusion region 137 makes it possible to reduce the potential of a boundary portion between the photo diode 121 and the memory part 123. The reduced-potential portion serves as an overflow path 140.

That is, a charge which is generated in the photo diode 121 and exceeds a potential of the overflow path 140 is automatically leaked into the memory part 123 and accumulated therein. In other words, a charge having a potential equal to or lower than that of the overflow path 140 is accumulated in the photo diode 121. In this way, by forming the overflow path 140, a charge generated at low illumination intensity can be preferentially accumulated in the photo diode 121.

The overflow path 140 has a function of an intermediate charge transfer part. In other words, in an exposure time period when an image capturing operation is performed simultaneously on all of a plurality of unit pixels, the overflow path 140 as the intermediate charge transfer part transfers, as a signal charge to the memory part 123, the charge which is generated by the photoelectric conversion in the photo diode 121 and exceeds a predetermined charge amount, the exceeding being determined based on the potential of the overflow path 140.

Further, the unit pixel 120 is provided with a of a p-impurity diffusion region 138 below the gate electrode 129A and in a boundary portion between the photo diode 121 and the drain part 136. Providing the impurity diffusion region 138 makes it possible to reduce the potential of the boundary portion between the photo diode 121 and the drain part 136.

Note that in the unit pixel 120, an off-state voltage applied as a transfer pulse TRX, the transfer pulse TRG, or the control pulse ABG to the gate electrode of the corresponding gate is a negative voltage.

The CMOS image sensor 100 in such a configuration starts the exposure simultaneously for all the pixels, terminates the exposure simultaneously for all the pixels, and transfers the charge accumulated in the photo diode 121 to the light-shielded memory part 123, so that a global shutter operation (global exposure) is thereby implemented. The global shutter operation enables image capturing without distortion using the same exposure time period for all the pixels.

[Operation for Providing Image Suitable for Use]

Meanwhile, when the unit pixels 120 arranged in the pixel array section 111 operate in accordance with a switched-over drive method, the CMOS image sensor 100 can provide a pixel signal for generating an image suitable for use. Hence, with reference to FIGS. 11 to 13, a description is given next of a method of providing a pixel signal for generating an image suitable for use, the method being used by the CMOS image sensor 100.

(Method for Driving Unit Pixels)

Figure 11:
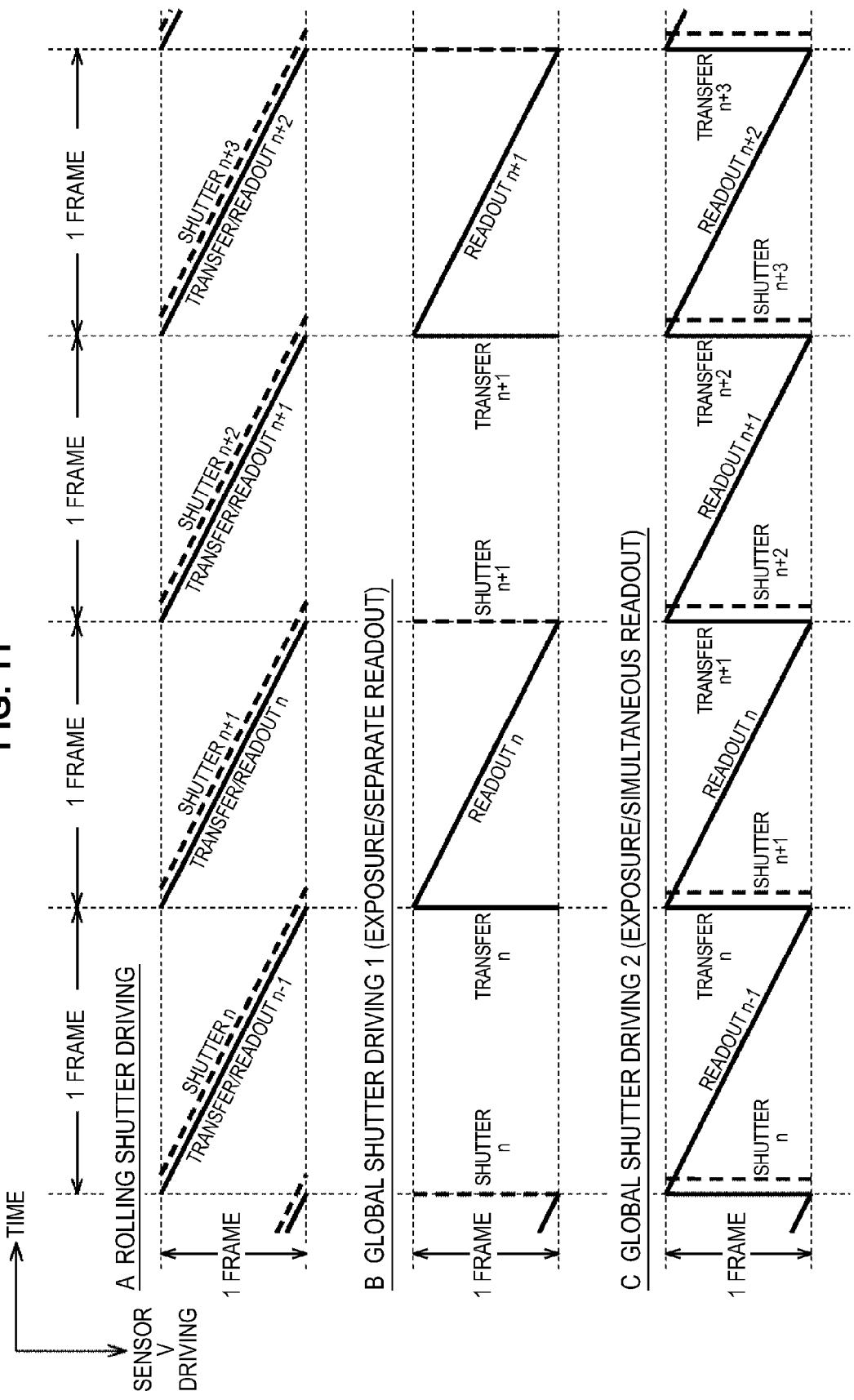
FIG. 11 is a timing chart illustrating a method for driving the unit pixels.

FIG. 11 is a timing chart illustrating a method for driving the unit pixels 120. A drive operation includes "shutter", "transfer", and "readout" operations. The "shutter" operation means that the photo diode 121 and the memory part 123 are reset, and the exposure is started; "transfer", a charge is transferred from the photo diode 121 to the memory part 123; and "readout", a charge is read out from the floating diffusion 125. A period from "shutter" to "transfer" is shown as the exposure time period from the start to the end of exposure. In FIG. 11, time is shown in the horizontal direction, while a scanning direction is shown in the vertical direction.

Note that the timing chart in FIG. 11 shows not only drive methods using a global shutter driving 1 and a global shutter driving 2 but also a drive method using rolling shutter driving, for the purpose of comparison with the global shutter driving.

FIG. 11A illustrates a timing chart of the rolling shutter driving. In the rolling shutter driving, exposure, transfer, and readout are performed simultaneously on pixels arranged in the same row. For this reason, when being expressed in time series in FIG. 11, the exposure, the transfer, and the readout proceed in the oblique direction. Even in pixels forming the same frame, a time lag equivalent to up to one frame occurs.

FIG. 11B illustrates a timing chart of the global shutter driving 1. The global shutter driving 1 corresponds to the drive method used in the structure of the pixel including the overflow path 140. In the structure, a charge which is generated in the photo diode 121 and exceeds the potential of the overflow path 140 is accumulated in the memory part 123. Accordingly, it is possible to accumulate charges in the exposure time period in both the photo diode 121 and the memory part 123, and thus to possible to increase the saturation charge amount.

As described above, the global shutter driving 1 uses the memory part 123 in the exposure time period, and thus it is not possible to perform exposure during readout. This means that the exposure and the transfer are performed simultaneously for all the pixels, and the readout is performed in row unit. In addition, in the global shutter driving 1, charges are accumulated in both the photo diode 121 and the memory part 123, and thus the dynamic range of the saturation charge amount can be enhanced. However, the exposure and the readout are performed separately, and thus the sensitivity is deteriorated.

Thus, it can be said that the global shutter driving 1 is suitable for a case of generating an image for which priority should be given to dynamic range, such as a still image.

In addition, FIG. 11C illustrates a timing chart of the global shutter driving 2. The global shutter driving 2 corresponds to the drive method used in the structure of the pixel without the overflow path 140. In the structure, a charge is accumulated only in the photo diode 121 in the exposure time period. Accordingly, the memory part 123 is not used in the exposure time period, and thus the exposure can be performed during the readout.

As described above, in the global shutter driving 2, the exposure and the transfer are performed simultaneously for all the pixels, and further the readout is also performed simultaneously. In addition, in the global shutter driving 2, a charge is accumulated only in the photo diode 121. Thus, the dynamic range of the saturation charge amount is lower than that in the case of the global shutter driving 1, but the sensitivity is higher because the exposure and the readout are performed simultaneously.

Thus, it can be said that the global shutter driving 2 is suitable for a case of generating an image for which priority should be given to the sensitivity, such as a moving image.

As described above, when a pixel signal generated by the CMOS image sensor 100 is used for a still image, an effective way to increase the saturation charge amount is driving pixels by the global shutter driving 1 and setting the exposure time period and a readout time period (charge holding time period) to be performed separately.

On the other hand, when a pixel signal generated by the CMOS image sensor 100 is used for a moving image, an effective way to increase the frame rate of the moving image is driving the pixels by the global shutter driving 2 and setting the exposure time period and the readout time period (charge holding time period) to synchronize with each other.

Unit Pixel in First Embodiment

Figure 12:
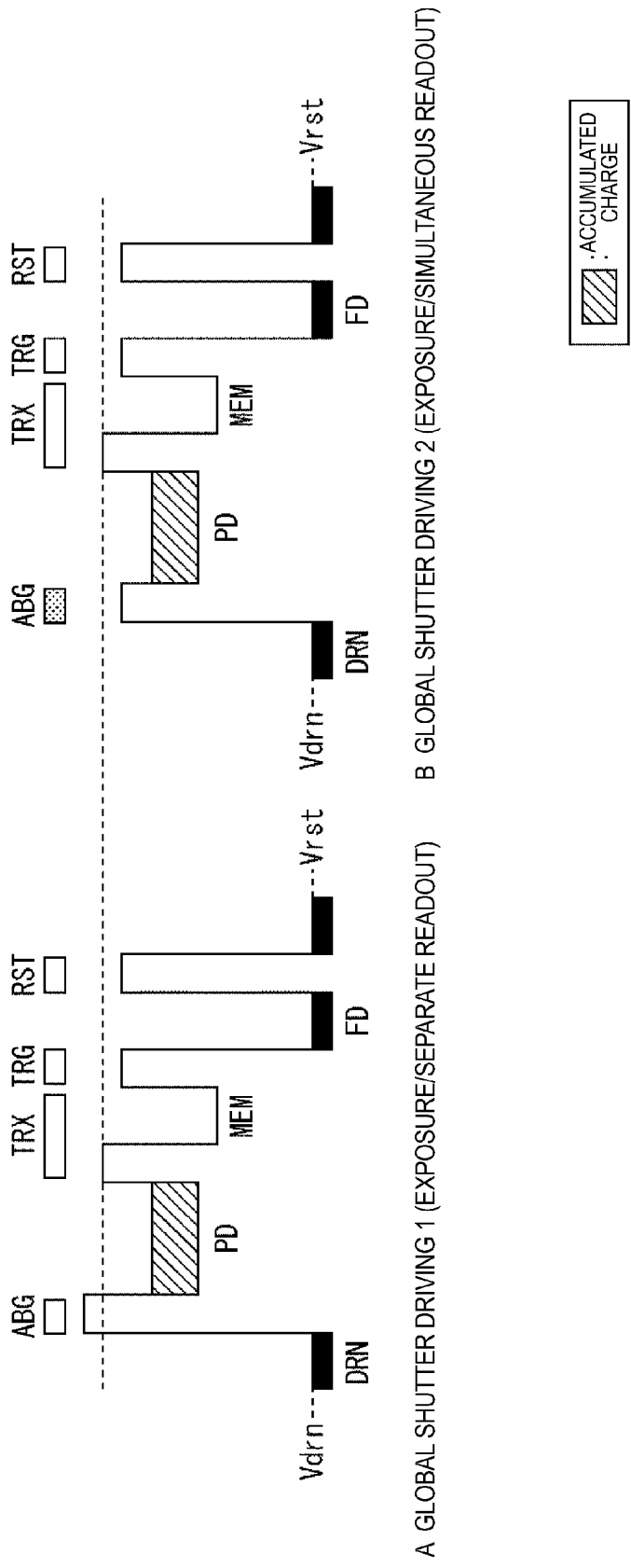
FIG. 12 is a potential diagram of each of unit pixels in a first embodiment.

FIG. 12 illustrates a potential diagram of each unit pixel 120 in a first embodiment. Note that an electric-potential is shown in the vertical direction in the potential diagram, and a higher electric-potential is shown at a lower position.

Squares below letters for the control pulse ABG, the transfer pulse TRX, the transfer pulse TRG, and the control pulse RST in FIG. 12 show states of the control pulse ABG, the transfer pulse TRX, the transfer pulse TRG, and the control pulse RST. Outlined squares each indicate that the corresponding pulse is off, and a hatched square indicates that a voltage of the pulse is a voltage between a voltage at an on time and a voltage at an off time (hereinafter, referred to as an "intermediate voltage").

In the unit pixel 120 in the first embodiment, the channel electric-potential of the charge discharging gate 129 is set by controlling the control pulse ABG to be applied to the gate electrode 129A.

(Global Shutter Driving 1 Based on Control Pulse ABG)

FIG. 12A illustrates a potential diagram in the case of driving the unit pixel 120 by the global shutter driving 1.

As illustrated in FIG. 12A, in the global shutter driving 1, the control pulse ABG to be applied to the gate electrode 129A is turned off to cause the channel electric-potential of the charge discharging gate 129 to be lower than an electric-potential of the overflow path 140 (electric-potential indicated by a dotted line in the figure).

In this case, when exceeding the electric-potential of the overflow path 140, the charge accumulated in the photodiode (PD) 121 flows into the memory part (MEM) 123, so that charge accumulation during the exposure time period is performed in both the photo diode 121 and the memory part 123. For this reason, it is necessary to set the exposure time period and the readout time period (charge holding time period) to be performed separately.

By controlling the control pulse ABG in this way, it is possible to drive the unit pixel 120 by the global shutter driving 1. Moreover, when the global shutter driving 1 based on the control pulse ABG is performed, a larger saturation charge amount can be held than in the global shutter driving 2 performing charge accumulation in only the photo diode 121. Thus, the global shutter driving 1 is suitable for still image use.

(Global Shutter Driving 2 Based on Control Pulse ABG)

FIG. 12B illustrates a potential diagram in the case of driving the unit pixel 120 by the global shutter driving 2.

As illustrated in FIG. 12B, in the global shutter driving 2, an intermediate electric-potential is applied as the control pulse ABG to be applied to the gate electrode 129A to cause the channel electric-potential of the charge discharging gate 129 to be higher than the electric-potential of the overflow path 140 (electric-potential indicated by the dotted line in the figure) and to be lower than an electric-potential causing the photo diode 121 to be completely depleted.

In this case, since the charge accumulated in the photo diode (PD) 121 flows into the drain part (DRN) 136 before exceeding the potential of the overflow path 140, the charge accumulation is not performed in the memory part (MEM) 123. Accordingly, the charge accumulation during the exposure time period is performed only in the photo diode 121, and thus it is possible to set the accumulation time period and the readout time period (charge holding time period) to synchronize with each other.

By controlling the control pulse ABG in this way, it is possible to drive the unit pixel 120 by the global shutter driving 2. When the global shutter driving 2 based on the control pulse ABG is performed, the exposure and the readout are performed simultaneously. However, even if the exposure time is changed in the readout time period, the frame rate can be maintained. Thus, the global shutter driving 2 is suitable for moving image use.

Unit Pixel in Second Embodiment

Figure 13:
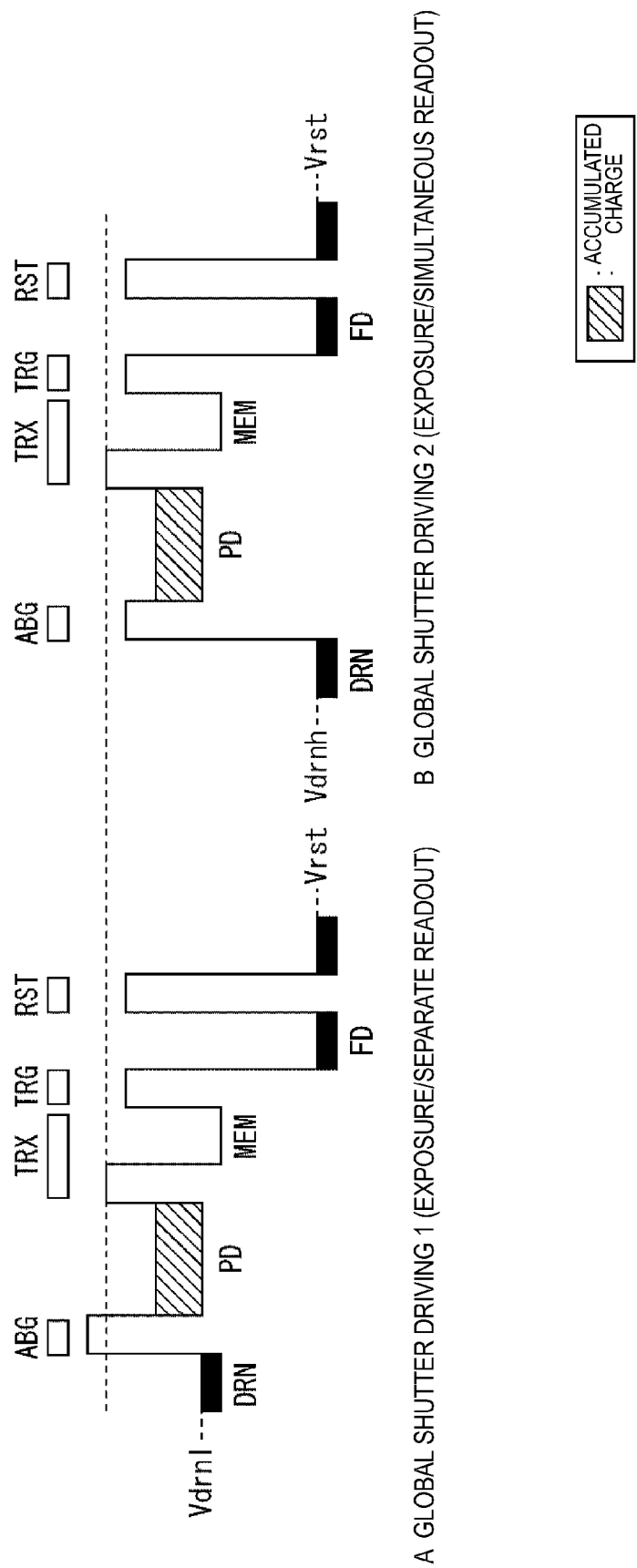
FIG. 13 is a potential diagram of each of unit pixels in a second embodiment.

FIG. 13 illustrates a potential diagram of the unit pixel 120 in a second embodiment. Note that an electric-potential is shown in the vertical direction in the potential diagram, and a higher electric-potential is shown at a lower position, like the potential diagram in FIG. 12. Also, squares shown below pulses indicate states of the respective pulses.

In the unit pixel 120 in the second embodiment, the channel electric-potential of the charge discharging gate 129 is set by driving the drain part 136.

(Global Shutter Driving 1 Based on Drain Driving)

FIG. 13A illustrates a potential diagram in the case of driving the unit pixel 120 by the global shutter driving 1. Note that the voltage Vdrn to be applied to the drain part 136 through the contact for wiring has a relation of a voltage Vdrnh>a voltage Vdrnl.

As illustrated in FIG. 13A, in the global shutter driving 1, the drain part 136 is driven by applying the voltage Vdrnl thereto through the contact for wiring, so that the electric-potential thereof is lowered. Thereby, the channel electric-potential of the charge discharging gate 129 is made lower than an electric-potential of the overflow path 140 (electric-potential indicated by a dotted line in the figure)

In this case, when exceeding the electric-potential of the overflow path 140, the charge accumulated in the photodiode (PD) 121 flows into the memory part (MEM) 123, so that the charge accumulation during the exposure time period is performed in both the photo diode 121 and the memory part 123. For this reason, it is necessary to set the exposure time period and the readout time period (charge holding time period) to be performed separately.

By controlling the driving of the drain part 136 in this way, it is possible to drive the unit pixel 120 by the global shutter driving 1. Moreover, when the global shutter driving 1 based on the drain driving is performed, a larger saturation charge amount can be held than in the global shutter driving 2 performing the charge accumulation only in the photo diode 121. Thus, the global shutter driving 1 is suitable for the still image use.

(Global Shutter Driving 2 Based on Drain Driving)

FIG. 13B illustrates a potential diagram in the case of driving the unit pixel 120 by the global shutter driving 2.

As illustrated in FIG. 13B, in the global shutter driving 2, the drain part 136 is driven by applying the voltage Vdrnh through the contact for wiring to thereby cause the channel electric-potential of the charge discharging gate 129 to be higher than the electric-potential of the overflow path 140 (electric-potential indicated by the dotted line in the figure) and to be lower than the electric-potential causing the photo diode 121 to be completely depleted.

In other words, in the global shutter driving 2, the voltage Vdrnh is applied to the drain part 136 through the contact for wiring to raise the electric-potential of the drain part 136, so that a channel of the charge discharging gate 129 is depleted. Then, the electric-potential of the charge discharging gate 129 is set higher than the electric-potential of the overflow path 140. At this time, the channel of the charge discharging gate 129 may be formed as a buried channel in a region deeper in a direction to the substrate than a silicon surface. Such a configuration prevents the silicon surface of the photo diode 121 from being exposed during the exposure time period and thus deterioration of properties at dark can be prevented.

In this case, a charge accumulated in the photo diode (PD) 121 flows into the drain part (DRN) 136 before exceeding the potential of the overflow path 140, the charge accumulation during the exposure time period is performed only in the photo diode 121. Thus, it is possible to set the accumulation time period and the readout time period (charge holding time period) to synchronize with each other.

By controlling the driving of the drain part 136 in this way, it is possible to drive the unit pixel 120 by the global shutter driving 2. When the global shutter driving 2 based on the drain driving is performed, the exposure and the readout are performed simultaneously. However, even if the exposure time is changed in the readout time period, the frame rate can be maintained. Thus, the global shutter driving 2 is suitable for the moving image use.

As described above, each of the unit pixels 120 arranged in the pixel array section 111 of the CMOS image sensor 100 controls the control pulse ABG or the driving of the drain part 136 to cause the channel electric-potential of the charge discharging gate 129 to be lower than the electric-potential of the overflow path 140. Thereby, the global shutter driving 1 is performed. Also, each of the unit pixels 120 arranged in the pixel array section 111 of the CMOS image sensor 100 controls the control pulse ABG or the driving of the drain part 136 to cause the channel electric-potential of the charge discharging gate 129 to be higher than the electric-potential of the overflow path 140 and to be lower than the electric-potential causing the photo diode 121 to be completely depleted. Thereby, the global shutter driving 2 is performed.

Each unit pixel 120 is driven by the global shutter driving 1 when a pixel signal generated by the CMOS image sensor 100 is used for a still image, and is driven by the global shutter driving 2 when the pixel signal is used for a moving image. Thereby, it is possible to generate an image suitable for use by using the one CMOS image sensor 100.

[Modification of Solid-State Imaging Apparatus Configuration]

Figure 14:
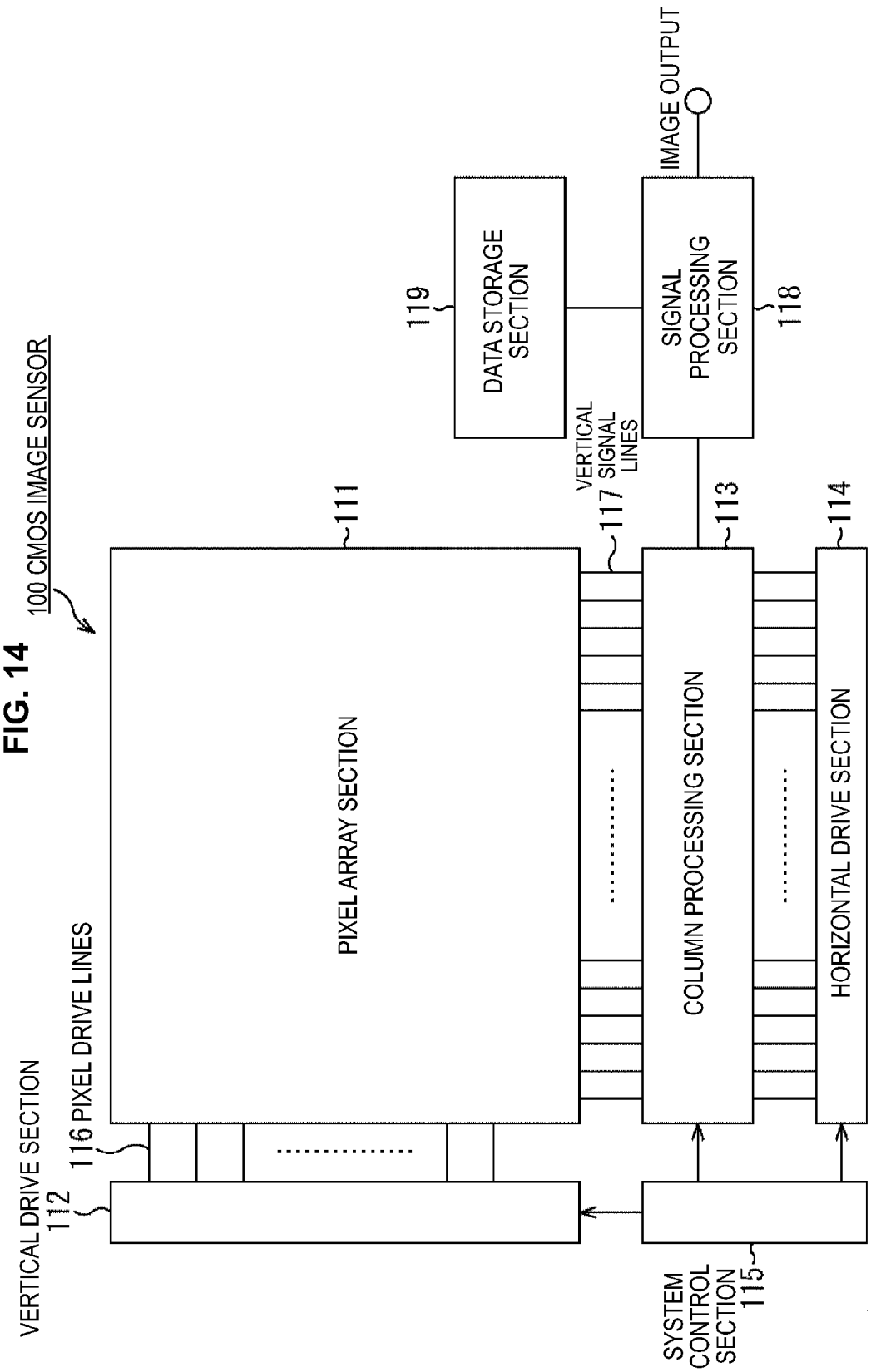
FIG. 14 is a diagram illustrating another configuration example of the CMOS image sensor.

In the aforementioned description, the configuration is employed in which the data storage section 119 is provided in parallel with the signal processing section 118 in the subsequent stage of the column processing section 113, as illustrated in FIG. 9, but is not limited to this. For example, as illustrated in FIG. 14, another configuration may be employed in which the data storage section 119 is provided in parallel with the column processing section 113. With the configuration, the horizontal drive section 114 simultaneously reads out data by horizontal scanning, and the signal processing section 118 in the subsequent stage executes signal processing on the data.

Figure 15:
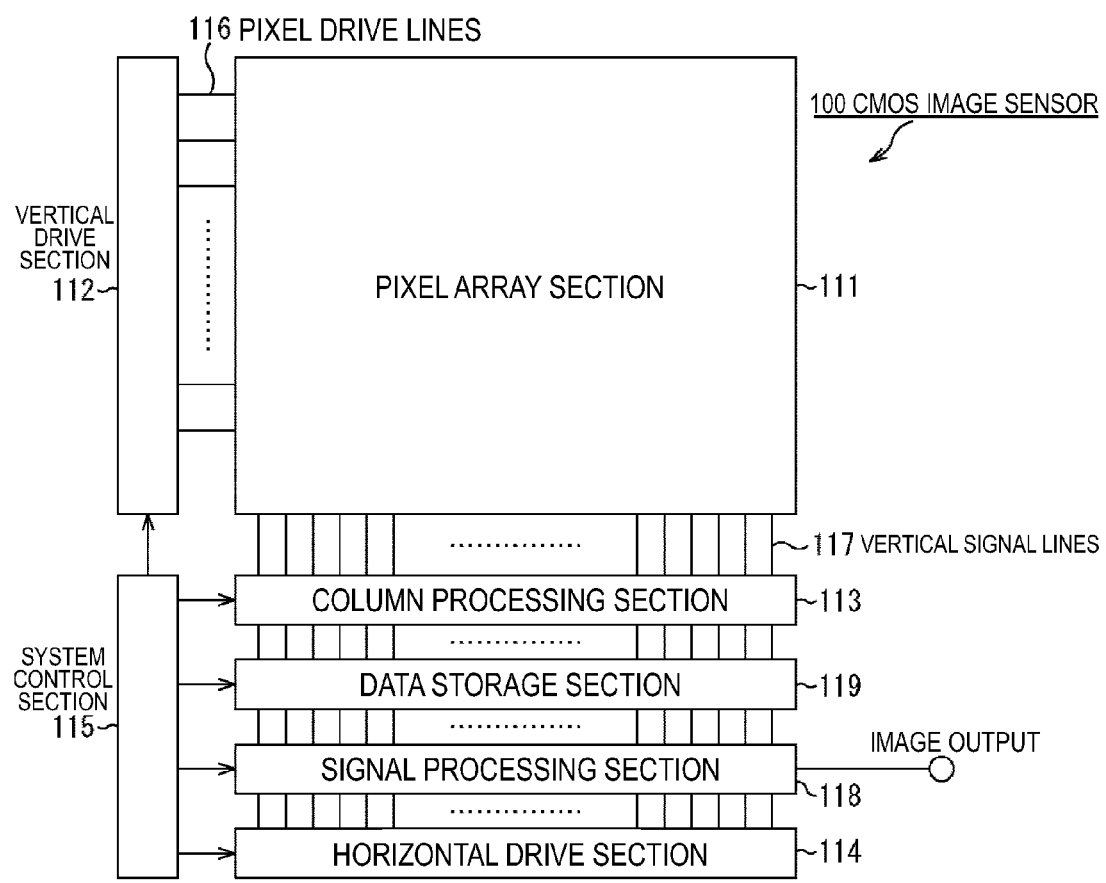
FIG. 15 is a diagram illustrating still another configuration example of the CMOS image sensor.

Further, as illustrated in FIG. 15, still another configuration may be employed in which the column processing section 113 is provided with an AD conversion function of performing AD conversion for each column or each column group of the pixel array section 111, and in which the data storage section 119 and the signal processing section 118 are provided in parallel with the column processing section 113. With the configuration, the signal processing section 118 performs signal removing processing in an analog or digital manner, and thereafter the data storage section 119 and the signal processing section 118 execute processing thereof for each column or each column group.

Note that application of the present technology is not limited to the application to the solid-state image sensor. That is, the present technology is applicable to a general electronic device using a solid-state image sensor for an image capturing section (a photoelectric conversion section), the general electronic device including an imaging apparatus such as a digital still camera or a video camera, a mobile terminal device having an image capturing function, a copier using a solid-state image sensor for an image reading section, and the like. The solid-state image sensor may be formed as one chip or may be formed as a module having an image capturing function in which an image capturing section and either a signal processing section or an optical system are packaged together.

[Configuration Example of Electronic Device to which Present Technology is Applied]

Figure 16:
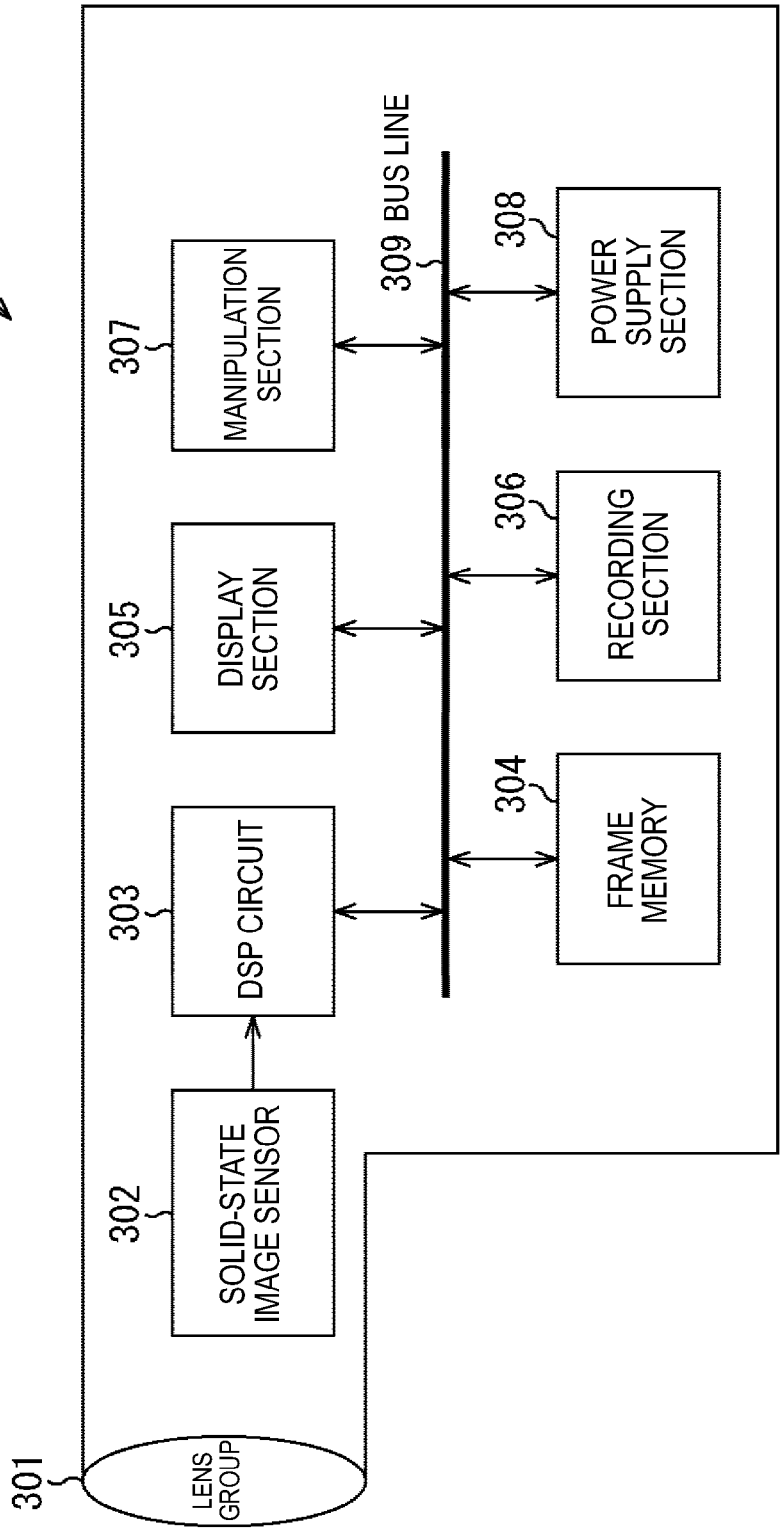
FIG. 16 is a diagram illustrating a configuration example of an imaging apparatus.

FIG. 16 is a block diagram of a configuration example of an imaging apparatus serving as an electronic device to which the present technology is applied.

An imaging apparatus 300 in FIG. 16 includes: a lens group 301 formed by a lens group or the like; a solid-state image sensor (an image-capturing device) 302 employing the aforementioned configuration of the unit pixels 120, and a DSP (Digital Signal Processor) circuit 303 which is a camera signal processing circuit. The imaging apparatus 300 also includes a frame memory 304, a display section 305, a recording section 306, a manipulation section 307, and a power supply section 308. The DSP circuit 303, the frame memory 304, the display section 305, the recording section 306, the manipulation section 307, and the power supply section 308 are connected to each other via a bus line 309.

The lens group 301 takes in incident light (image light) from a subject to form an image on an imaging surface of the solid-state image sensor 302. The solid-state image sensor 302 converts a light amount of incident light into an electrical signal on a pixel basis and outputs the electrical signal, the incident light being used for forming the image on the imaging surface by the lens group 301. It is possible to use, as the solid-state image sensor 302, a solid-state image sensor such as the CMOS image sensor 100 according to the aforementioned embodiment which is arranged on the CMOS image sensor, that is, a solid-state image sensor which makes it possible to capture an image without distortion by using global exposure.

The display section 305 includes a panel display device such as a liquid crystal panel or an organic EL (Electro Luminescence) panel, and displays a moving image or a still image captured by the solid-state image sensor 302. The recording section 306 records the moving image or the still image captured by the solid-state image sensor 302 in a recording medium such as a video tape, a DVD (Digital Versatile Disk), or a flash memory.

The manipulation section 307 issues manipulation instructions for various functions of the imaging apparatus 300 in accordance with user's manipulation. The power supply section 308 appropriately supplies the DSP circuit 303, the frame memory 304, the display section 305, the recording section 306, and the manipulation section 307 with power to cause these sections to operate.

As described above, the use of the CMOS image sensor 100 according to the aforementioned embodiment as the solid-state image sensor 302 makes it possible to perform processing of reducing noise including even kTC noise and thus to secure high S/N. Accordingly, it is possible to achieve high quality of a captured image in the imaging apparatus 300 such as a video camera, a digital still camera, or further a camera module for a mobile device such as a mobile phone.

In addition, the aforementioned embodiment has been described by taking as an example the case where the present technology is applied to the CMOS image sensor including the unit pixels arranged in a matrix form, the unit pixels each sensing, as a physical quantity, a signal charge corresponding to a light amount of visible light. The application of the present technology, however, is not limited to the application to the CMOS image sensor. The present technology is applicable to a general column-system solid-state image sensor including a column processing section arranged for each pixel column in a pixel array section.

The application of the present technology is not limited to the application to the solid-state image sensor which captures an image by sensing distribution of incident light amounts of visible light. The present technology is also applicable to: a solid-state image sensor which captures an image based on distribution of incidence amounts of infrared rays, X-rays, particles or the like; and a general solid-state image sensor in a broad sense (a physical-quantity distribution sensing device) such as a fingerprint detection sensor which captures an image by sensing distribution of other physical quantities such as pressures or electrostatic capacitances.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image sensor including:
  a plurality of unit pixels each including
    a photoelectric transducer which generates a charge corresponding to an amount of incident light and accumulates the charge therein,
    a first transfer gate which transfers the charge accumulated in the photoelectric transducer,
    a charge holding region in which the charge transferred from the photoelectric transducer by the first transfer gate is held,
    a second transfer gate which transfers the charge held in the charge holding region,
    a floating diffusion region in which the charge transferred from the charge holding region by the second transfer gate is held to be read out as a signal,
    a charge discharging gate which transfers the charge received from the photoelectric transducer, to a charge discharging part, and
    a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region,
  wherein as a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

(2) The solid-state image sensor according to (1),
  wherein when an intermediate electric-potential is applied to the charge discharging gate as a gate electric-potential, the channel electric-potential is set at a predetermined electric-potential.

(3) The solid-state image sensor according to (1),
  wherein when an electric-potential of a drain of the charge discharging part is driven, the channel electric-potential is set at a predetermined electric-potential.

(4) The solid-state image sensor according to (3),
  wherein a channel of the charge discharging gate is formed in a region deeper in a direction to a substrate than a silicon surface.

(5) The solid-state image sensor according to any one of (1) to (4),
  wherein an off-state voltage of each of the charge discharging gate, the first transfer gate, and the second transfer gate is a negative voltage.

(6) A control method for a solid-state image sensor, the solid-state image sensor including
  a plurality of unit pixels each including
    a photoelectric transducer which generates a charge corresponding to an amount of incident light and accumulates the charge therein,
    a first transfer gate which transfers the charge accumulated in the photoelectric transducer,
    a charge holding region in which the charge transferred from the photoelectric transducer by the first transfer gate is held,
    a second transfer gate which transfers the charge held in the charge holding region,
    a floating diffusion region in which the charge transferred from the charge holding region by the second transfer gate is held to be read out as a signal,
    a charge discharging gate which transfers the charge received from the photoelectric transducer, to a charge discharging part, and
    a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region,
  the method including:
    as a channel electric-potential of the charge discharging gate, setting an electric-potential lower than an electric-potential of the overflow path, or setting an electric-potential higher than the electric-potential of the overflow path and lower than an electric-potential causing the photoelectric transducer to be completely depleted.

(7) An electronic device having a solid-state image sensor mounted thereon, the solid-state image sensor including
  a plurality of unit pixels each including
    a photoelectric transducer which generates a charge corresponding to an amount of incident light and accumulates the charge therein,
    a first transfer gate which transfers the charge accumulated in the photoelectric transducer, a charge holding region in which the charge transferred from the photoelectric transducer by the first transfer gate is held, a second transfer gate which transfers the charge held in the charge holding region, a floating diffusion region in which the charge transferred from the charge holding region by the second transfer gate is held to be read out as a signal, a charge discharging gate which transfers the charge received from the photoelectric transducer, to a charge discharging part, and a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region, wherein as a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

The present disclosure contains subject matter related to that disclosed in Japanese Priority Patent Application JP 2012-203207 filed in the Japan Patent Office on Sep. 14, 2012, the entire content of which is hereby incorporated by reference.

What is claimed is:

1. A solid-state image sensor comprising:
a plurality of unit pixels each including
a photoelectric transducer which generates a charge corresponding to an amount of incident light and accumulates the charge therein,
a first transfer gate which transfers the charge accumulated in the photoelectric transducer,
a charge holding region in which the charge transferred from the photoelectric transducer by the first transfer gate is held,
a second transfer gate which transfers the charge held in the charge holding region,
a floating diffusion region in which the charge transferred from the charge holding region by the second transfer gate is held to be read out as a signal,
a charge discharging gate which transfers the charge received from the photoelectric transducer, to a charge discharging part, and
a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region,
wherein as a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

2. The solid-state image sensor according to claim 1, wherein when an intermediate electric-potential is applied to the charge discharging gate as a gate electric-potential, the channel electric-potential is set at a predetermined electric-potential.

3. The solid-state image sensor according to claim 1, wherein when an electric-potential of a drain of the charge discharging part is driven, the channel electric-potential is set at a predetermined electric-potential.

4. The solid-state image sensor according to claim 3, wherein a channel of the charge discharging gate is formed in a region deeper in a direction to a substrate than a silicon surface.

5. The solid-state image sensor according to claim 1, wherein an off-state voltage of each of the charge discharging gate, the first transfer gate, and the second transfer gate is a negative voltage.

6. A control method for a solid-state image sensor, the solid-state image sensor including
a plurality of unit pixels each including
a photoelectric transducer which generates a charge corresponding to an amount of incident light and accumulates the charge therein,
a first transfer gate which transfers the charge accumulated in the photoelectric transducer,
a charge holding region in which the charge transferred from the photoelectric transducer by the first transfer gate is held,
a second transfer gate which transfers the charge held in the charge holding region,
a floating diffusion region in which the charge transferred from the charge holding region by the second transfer gate is held to be read out as a signal,
a charge discharging gate which transfers the charge received from the photoelectric transducer, to a charge discharging part, and
a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region,
the method comprising:
as a channel electric-potential of the charge discharging gate, setting an electric-potential lower than an electric-potential of the overflow path, or setting an electric-potential higher than the electric-potential of the overflow path and lower than an electric-potential causing the photoelectric transducer to be completely depleted.

7. An electronic device having a solid-state image sensor mounted thereon, the solid-state image sensor including
a plurality of unit pixels each including
a photoelectric transducer which generates a charge corresponding to an amount of incident light and accumulates the charge therein,
a first transfer gate which transfers the charge accumulated in the photoelectric transducer,
a charge holding region in which the charge transferred from the photoelectric transducer by the first transfer gate is held,
a second transfer gate which transfers the charge held in the charge holding region,
a floating diffusion region in which the charge transferred from the charge holding region by the second transfer gate is held to be read out as a signal, a charge discharging gate which transfers the charge received from the photoelectric transducer, to a charge discharging part, and a structure including an overflow path formed in a boundary portion between the photoelectric transducer and the charge holding region, the overflow path being formed at a potential for determining a predetermined charge amount and transferring a charge exceeding the predetermined charge amount as a signal charge from the photoelectric transducer to the charge holding region, wherein as a channel electric-potential of the charge discharging gate, an electric-potential lower than an electric-potential of the overflow path is set, or an electric-potential higher than the electric-potential of the overflow path and lower than an electric-potential causing the photoelectric transducer to be completely depleted is set.

* * * * *